United States Patent [19]

Takano et al.

[11] Patent Number: 5,143,898
[45] Date of Patent: Sep. 1, 1992

[54] SUPERCONDUCTING WIRE

[75] Inventors: Satoshi Takano; Noriki Hayashi, both of Osaka, Japan

[73] Assignee: Sumitomo Electric Industries, Ltd., Osaka, Japan

[21] Appl. No.: 475,048

[22] Filed: Feb. 5, 1990

[30] Foreign Application Priority Data

Feb. 4, 1989 [JP] Japan ................. 1-26094
Feb. 4, 1989 [JP] Japan ................. 1-26095

[51] Int. Cl.$^5$ .................................. B32B 9/00
[52] U.S. Cl. .......................... 505/1; 505/701; 505/702; 505/703; 505/704; 428/409; 428/426; 428/432; 428/688; 428/930
[58] Field of Search .......... 505/1, 701-704; 428/409, 426, 432, 688, 901, 930

[56] References Cited

U.S. PATENT DOCUMENTS

| | | | |
|---|---|---|---|
| 4,915,988 | 4/1990 | Erbil | 427/255.1 |
| 4,927,670 | 5/1990 | Erbil | 427/255 |

FOREIGN PATENT DOCUMENTS

| | | |
|---|---|---|
| 0290357 | 11/1988 | European Pat. Off. |
| 0298461 | 1/1989 | European Pat. Off. |
| 0304061 | 2/1989 | European Pat. Off. |

OTHER PUBLICATIONS

CA 113(2):16184a, Integrated Circ. Pkg., Sumitomo Elec. Dec. 6, 1990.
K. Hoshino, et al., Japanese J. of Applied Physics, vol. 27, No. 7, Jul. 1988 pp. L1297-L1299.

*Primary Examiner*—Patrick J. Ryan
*Attorney, Agent, or Firm*—Pennie & Edmonds

[57] ABSTRACT

A superconducting wire comprises a flexible base material having average surface roughness of not more than 0.05 μm and an oxide superconducting layer formed on the base material.

A superconducting wire comprises a flexible base material of yttria stabilized zirconia containing less than 0.1 percent by weight of an Al impurity and an oxide superconducting layer formed on the base material.

4 Claims, 1 Drawing Sheet

SUPERCONDUCTING WIRE

BACKGROUND OF THE INVENTION

1. Field of the Invention

The present invention relates to a superconducting wire, and more particularly, it relates to a superconducting wire which comprises a base material and an oxide superconducting layer formed on the base material.

2. Description of the Background Art

Metal, compound and ceramic materials have been generally known as superconductors, and study has been made to apply such superconductors to various uses. A superconductor loses all resistance to electric current when the same is maintained at a temperature lower than its critical temperature, and attempts have been made for applying such property to generation of a high magnetic field, high-density bulk power transmission and the like.

A ceramic superconductive material has been recently highlighted in such a point that its critical temperature for a superconducting phenomenon can be increased. Such a superconductive material can be worked into an elongated linear member, for example, for application to power transmission/distribution, electrical connection of various types of devices or elements, line winding or the like.

In order to work a conventional compound superconductive material into such a wire rod, there has been proposed a method of forming a layer of the superconductive material on a base material of stainless steel etc. or an alloy tape by sputtering or the like. Excellent flexibility can be easily attained by forming the superconducting layer on such a tape-type base.

If a layer of a ceramic superconductive material is formed on a general metal or ceramic tape, however, it is impossible to attain good superconductivity particularly when the superconducting layer has a small thickness of not more than 1 $\mu$m.

For example, Japanese Patent Laying-Open Gazette No. 271816/1988 discloses a superconducting wire which comprises an oxide single crystal fiber member and a layer of an oxide superconductor formed on the oxide single crystal fiber member. Such an oxide superconducting layer can be formed by a vapor-phase thin film forming method such as vapor deposition, sputtering, CVD or the like.

In order to attain high critical current density in such a superconducting wire, however, it is generally necessary to perform heat treatment at a high temperature. Also when a layer of an oxide superconductor is formed on a single crystal member of MgO, SrTiO$_3$ or the like, which can provide a film of excellent crystallinity, it is necessary to keep a substrate temperature of 600° to 700° C. during film formation and to further perform heat treatment at a temperature of at least 900° C. after film formation.

When a layer of an oxide superconductor is formed on a substrate of a flexible metal, ceramic material or glass, heat treatment must be performed at a higher temperature for a longer time to compensate for inferior crystallinity. If such high-temperature heat treatment is performed for a long time, however, diffusion reaction is caused between the superconducting layer and the substrate, to deteriorate superconductivity of the oxide superconductor layer. In order to prevent such diffusion reaction, an intermediate layer may be formed between the substrate and the oxide superconductor layer. However, such an intermediate layer must be at least 1 $\mu$m in thickness to withstand the high-temperature heat treatment which is performed for a long time, and hence the cost for forming the intermediate layer is increased.

SUMMARY OF THE INVENTION

An object of the present invention is to improve superconductivity of a superconducting wire, which comprises a base material and an oxide superconducting layer formed on the base material.

Another object of the present invention is to provide a superconducting wire which is improved in superconductivity, by reducing influence exerted by diffusion reaction caused in heat treatment.

A superconducting wire according to a first aspect of the present invention comprises a flexible base material having average surface roughness of not more than 0.05 $\mu$m, and an oxide superconducting layer which is formed on the base material.

In the first aspect of the present invention, the base material is not particularly restricted but may be formed of a metal, an alloy, or ceramic material. The alloy material is preferably prepared from an Ni base alloy, while the ceramic material is preferably prepared from yttria stabilized zirconia (YSZ).

According to this aspect, the base material may be formed by a plurality of metal or alloy layers, having a ceramic coating layer.

FIG. 2 typically illustrates a film thickness state of a superconducting layer 1 which is formed on a base material 3 having large average surface roughness, and FIG. 3 typically illustrates a film thickness state of a superconducting layer 1 which is formed on a base material 2 having small average surface roughness. When the superconducting layer 1 is formed on the base material 3 having large average surface roughness as shown in FIG. 2, a large number of thin portions a are defined in the superconducting layer 1 to reduce bond strength. Thus, the overall critical temperature $T_C$ or critical current density $J_C$ may be reduced.

When the superconducting layer 1 is formed on the base material 2 having small average surface roughness as shown in FIG. 3, on the other hand, no thin portions a are defined but the critical temperature and critical current density can be increased.

FIG. 4 typically illustrates a film surface smoothing state of a superconducting layer 1 which is formed on a base material 3 having large average surface roughness, and FIG. 5 typically illustrates a film surface smoothing state of a superconducting layer 1 which is formed on a base material 2 having small average surface roughness. When the superconducting layer 1 is formed on the base material 3 having large average surface roughness as shown in FIG. 4, the film surface of the superconducting layer 1 is unsmoothed. When the superconducting layer 1 is formed on the base material 2 having small average surface roughness as shown in FIG. 5, on the other hand, the film surface of the superconducting layer 1 can be smoothed.

FIG. 6 typically illustrates orientation of a superconducting layer 1 which is formed on a base material 3 having large average surface roughness, and FIG. 7 typically illustrates orientation of a superconducting layer 1 which is formed on a base material 2 having small average surface roughness.

When the superconducting layer 1 is formed on the base material 3 having large average surface roughness as shown in FIG. 6, the superconducting layer 1 is deteriorated in orientation due to surface irregularity of the base material 3. When the superconducting layer 1 is formed on the base material 2 having small surface roughness as shown in FIG. 7, on the other hand, the superconducting layer 1 is improved in orientation.

According to the first aspect of the present invention, the superconducting layer formed on the base material is improved in superconductivity due to the aforementioned film thickness uniformalizing effect, film surface smoothing effect and orientation improving effect.

A superconducting wire according to a second aspect of the present invention comprises a flexible base material which is formed of yttria stabilized zirconia containing less than 0.1 percent by weight of an Al impurity, and an oxide superconducting layer formed on the base material.

In the second aspect of the present invention, the amount of the Al impurity, which is contained in yttria stabilized zirconia forming the base material, is less than 0.1 percent by weight, and more preferably, less than 0.05 percent by weight. Throughout the specification, the term "the amount of the Al impurity" indicates the impurity content of $Al_2O_3$.

In the second aspect of the present invention, yttria stabilized zirconia forming the base material contains less than 0.1 percent by weight of the Al impurity, since Al is most diffusible within impurities which are contained in yttria stabilized zirconia. Thus, it is possible to suppress deterioration of superconductivity, particularly the critical temperature $T_C$, by reducing diffusion reaction of Al.

If a YBaCuO oxide superconducting layer is formed on a base material of yttria stabilized zirconia containing at least 0.1 percent by weight of the Al impurity, an oxide, particularly that consisting of $Y_2Ba_1Cu_1O_5$, is easily formed. Due to formation of the oxide having such composition, the critical temperature $T_C$ and critical current density $J_C$ are reduced. The present invention has been achieved with discovery of such a phenomenon that a different phase such as $Y_2Ba_1Cu_1O_5$ is easily formed when the Al impurity content exceeds 0.1 percent by weight.

In the oxide superconducting wire according to the second aspect of the present invention, the oxide superconducting layer is formed on the base material of yttria stabilized zirconia containing less than 0.1 percent by weight of an Al impurity. Thus, the base material contains a small amount of the most diffusible Al according to this aspect, and hence it is possible to suppress diffusion reaction during heat treatment, thereby suppressing deterioration in superconductivity caused by heat treatment.

These and other objects, features, aspects and advantages of the present invention will become more apparent from the following detailed description of the present invention when taken in conjunction with the accompanying drawings.

DESCRIPTION OF THE PREFERRED EMBODIMENTS

Example I

Materials of yttria stabilized zirconia (YSZ) were prepared in levels of 40 Å, 100 Å, 400 Å, 1000 Å and 10000 Å in surface roughness (Ra). The surface roughness levels were measured through DEKTAK3030, a contour measuring apparatus by Sloan Inc., U.S.A., with stylus pressure of 30 mg and measurement distance of 100 μm. Superconducting films of $Y_1Ba_2Cu_3O_{7-\delta}$ were formed on tapes of the YSZ materials by RF magnetron sputtering, to be 0.5 μm and 1 μm in thickness. Film forming conditions were as follows:

Target Diameter: 100 mm
Substrate Temperature: 550° C.
Gas Pressure: $5 \times 10^{-2}$ Torr
Oxygen Partial Pressure ($O_2+Ar$): 50%
RF Power: 100 W
Spacing between Target and Substrate: 60 mm The sputtered samples were subjected to heat treatment in an oxygen atmosphere at 900° C. for one hour. Then the samples of 0.5 μm in thickness were subjected to measurement of critical temperatures $T_C$, and the samples of 1 μm in thickness were subjected to measurement of critical current density values $J_C$ by a DC four-terminal method.

Figure 1:
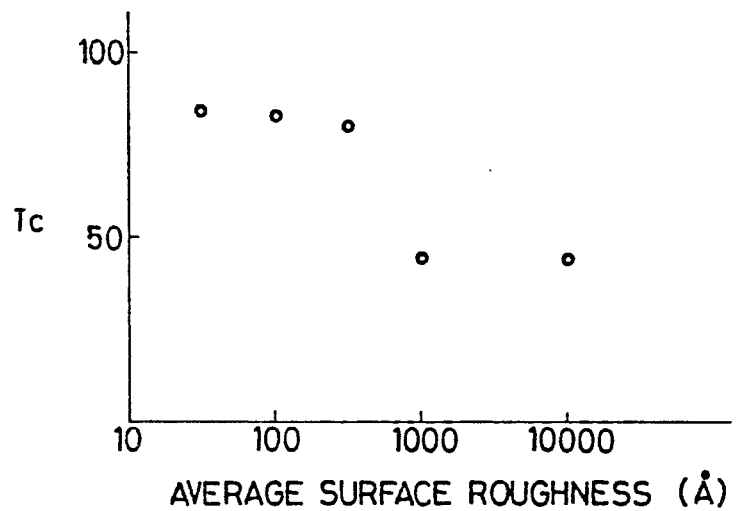
FIG. 1 shows critical temperatures and critical current density values of superconducting layers which were formed on base materials of various average surface roughness levels.
Figure 2:
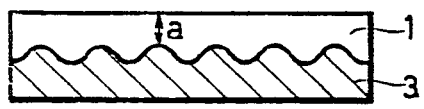
FIG. 2 typically illustrates a film thickness state of a superconducting layer which is formed on a base material having large average surface roughness.
Figure 3:
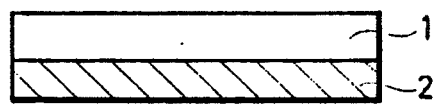
FIG. 3 typically illustrates a film thickness state of a superconducting layer which is formed on a base material having small average surface roughness.
Figure 4:
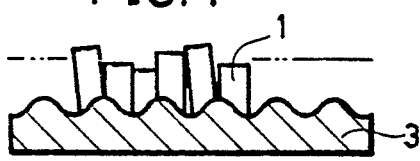
FIG. 4 typically illustrates a film surface smoothing state of a superconducting layer which is formed on a base material having large average surface roughness.
Figure 5:
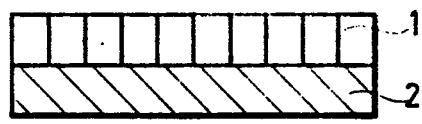
FIG. 5 typically illustrates a film surface smoothing state of a superconducting layer which is formed on a base material having small average surface roughness.
Figure 6:
FIG. 6 typically illustrates orientation of a superconducting layer which is formed on a base material having large average surface roughness.
Figure 7:
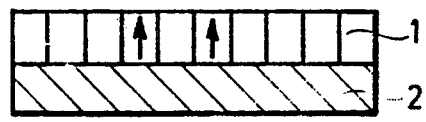
FIG. 7 typically illustrates orientation of a superconducting layer which is formed on a base material having small average surface roughness.

FIG. 1 shows the critical temperatures of the samples of 0.5 μm in thickness. As shown in FIG. 1, the samples of 40 Å, 100 Å and 400 Å in average surface roughness (Ra) exhibited critical temperatures of 82K, 81K and 80K respectively, while the samples of 1000 Å and 10000 Å in average surface roughness (Ra) exhibited low critical temperatures of 45K.

The samples of 1 μm in thickness were subjected to measurement of critical current density at a temperature of 77.3K. The samples of 40 Å, 100 Å and 400 Å in surface roughness exhibited values of $1 \times 10^4$, $9 \times 10^3$ and $1 \times 10^2$ A/cm² respectively.

As understood from the above observation, the sample of 400 Å (=0.04 μm) in surface roughness exhibited excellent values of $T_C$ and $J_C$, while those of the sample of 1000 Å (=0.1 μm) in thickness were abruptly reduced.

Example II

Y-Ba-Cu-O oxide superconducting layers were formed by RF magnetron sputtering on tape-type members of yttria stabilized zirconia, containing 3 percent by weight of Y, of 0.1 mm in thickness having different values of Al impurity concentration as shown in Table 1. Film forming conditions were as follows:

Target: $Y_1Ba_2Cu_{3.5}O_X$
Target Diameter: 100 mm
Substrate Temperature: 680° C.
RF Power: 100 W
Gas Pressure: 50 mTorr
Oxygen Partial Pressure ($O_2/(O_2+Ar)$): 50%
Spacing between Target and Substrate: 45 mm
Film Forming Time: 6 h.
Film Thickness: 0.8 to 1.2 μm Samples provided with the oxide superconducting layers were subjected to heat treatment in an oxygen atmosphere at 950° C. for 0.5 h. Table 1shows values of critical current density $T_C$, at which the oxide superconducting layers lost resistance R.

TABLE 1

| Sample No. | | Al Impurity Concentration (wt. %) | $T_C$ (R = 0) (K) |
|---|---|---|---|
| Example | 1 | 0.01 | 92 |
| | 2 | 0.03 | 91 |
| | 3 | 0.06 | 86 |
| | 4 | 0.08 | 83 |
| | 5 | 0.09 | 80 |
| Ref. Example | 1 | 0.10 | 60 |
| | 2 | 0.20 | 38 |
| | 3 | 0.30 | 21 |

As understood from Table 1, the oxide superconducting layers of Examples 1 to 5 exhibited high critical temperatures. On the other hand, reference examples 1 to 3, which contained excessive amounts of Al impurities beyond the scope of the present invention, exhibited extremely low critical temperatures as compared with Examples 1 to 5.

Although tape-type members of yttria stabilized zirconia were used in the above Examples, the base material employed in the present invention is not restricted to a tape-type one but may be provided in the form of a round wire, for example, with no particular restriction in sectional configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A superconducting wire comprising:
   a flexible base material of metal, Ni base alloy or yttrium stabilized zirconia having average surface roughness of not more than 0.05 μm
   a high $T_C$ oxide superconducting layer formed on said base material.

2. A superconducting wire in accordance with claim 1, wherein said flexible base material is formed of a metal or alloy having a coating layer of yttrium stabilized zirconia, MgO or $SrTiO_3$.

3. A superconducting wire comprising;
   a flexible base material of yttria stabilized zirconia containing less than 0.1 percent by weight of an Al impurity; and
   a high Tc oxide superconducting layer formed on said base material.

4. A super conducting wire in accordance with claim 3, wherein the content of said Al impurity is less than 0.05 percent by weight.

* * * * *